(12) United States Patent
Sugasawara et al.

(10) Patent No.: US 6,278,129 B1
(45) Date of Patent: Aug. 21, 2001

(54) CORROSION SENSITIVITY STRUCTURES FOR VIAS AND CONTACT HOLES IN INTEGRATED CIRCUITS

(75) Inventors: Emery O. Sugasawara, Pleasanton; Donald J. Esses, San Jose, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/464,225

(22) Filed: Dec. 15, 1999

Related U.S. Application Data

(62) Division of application No. 09/045,062, filed on Mar. 19, 1998.
(51) Int. Cl.$^7$ .................................................. H01L 23/58
(52) U.S. Cl. ............................................... 257/48; 257/620
(58) Field of Search ...................................... 257/48, 620

(56) References Cited

U.S. PATENT DOCUMENTS 5,646,400 7/1997 Perez et al. .
5,854,557 12/1998 Tiefnig .

FOREIGN PATENT DOCUMENTS 357032652A 2/1982 (JP) .
401197629A 8/1989 (JP) .

*Primary Examiner*—Sara Crane
*Assistant Examiner*—Thien F Tran
(74) *Attorney, Agent, or Firm*—Beyer Weaver & Thomas

(57) ABSTRACT

A die including a corrosion monitoring feature is described. The die includes: (i) a surface including an active die region and a scribeline region that is adjacent the active die region; (ii) an insulating layer disposed above the surface and includes a first corrosion sensitive metal plug and a second corrosion sensitive metal plug in the scribeline region; and (iii) a metallization layer positioned above the insulating layer, the first corrosion sensitive metal plug and the second corrosion sensitive metal plug in the scribeline region and the metallization layer disposed above second corrosion sensitive metal plug is patterned to provide the metallization layer with a first opening extending from a top surface of the metallization layer down to a top surface of the second corrosion sensitive metal plug such that a solvent introduced above the top surface of the metallization layer flows into the second corrosion sensitive metal plug disposed below through the first opening in the metallization layer.

28 Claims, 5 Drawing Sheets

CORROSION SENSITIVITY STRUCTURES FOR VIAS AND CONTACT HOLES IN INTEGRATED CIRCUITS

This is a Divisional application of copending prior application Ser. No. 09/045,062 filed Mar. 19, 1998, the disclosure of which is incorporated herein by reference.

BACKGROUND OF THE INVENTION

The present invention relates to corrosion sensitive structures for monitoring corrosion of vias and contact plugs in an active die region. More particularly, the present invention relates to corrosion sensitive structures formed in a scribeline region, which is adjacent the active die region, for monitoring corrosion of metal plugs of the active die region.

FIG. 1 shows a partially fabricated integrated circuit (IC) 10 that may undergo corrosion during or after post-etch cleaning processes. Some significant steps involved in forming partially fabricated integrated circuit (IC) 10 of FIG. 1 include blanket depositing a first dielectric layer 12, such as silicon dioxide ($SiO_2$), atop substrate layer 16. After first dielectric layer 12 is planarized, a masking layer (not shown), which typically includes photoresist, is blanket deposited over first dielectric layer 12 and patterned by conventional photolithography. Next, the unmasked portions of first dielectric layer 12 are etched to form a contact hole that provides an opening to the underlying device elements, e.g., source, drain and gate electrode, in substrate layer 16.

At this point, the partially fabricated IC is drenched in a bath of post-etch cleaning solution, which removes the etch residue present at the side-walls of the contact hole. Post-etch cleaning solutions may include amine based compounds, which are believed to be the active ingredient for cleaning the contact hole. By way of example, a post-etch cleaning solution EKC265™ obtained from EKC Technology Inc. of Hayward, Calif. includes hydroxylamine that is believed to be primarily responsible for removing the etch-residue from the contact hole. Other ingredients of EKC265™ include 2-(2-Aminoethoxy)Ethanol and Catechol.

After the post-etch cleaning process has concluded, an adhesion layer (not shown to simplify illustration), e.g., a titanium layer, a barrier layer (not shown to simplify illustration), e.g., a titanium nitride layer, and a tungsten layer are blanket deposited on the partially fabricated IC, filling the contact hole. The surface of the partially fabricated IC typically then undergoes chemical-mechanical polishing to form contact plug 14.

A metallization layer 18 is then blanket deposited and patterned over dielectric layer 12 such that metallization layer 18 partially covers contact plug 14. A post-etch cleaning process described above is carried out to remove post-etch residues from the metallization. Next, a second dielectric layer 20 is deposited over the surface of the partially fabricated IC. A via (hereinafter referred to as "via hole" to distinguish from "via plug," explained below) is etched into second dielectric layer 20 by conventional methods, during which the location of via hole typically misregisters and hangs to one side of metallization layer 18. Furthermore, at this location it is well known in the art that the dielectric layer frequently over etches, as shown in FIG. 1, and forms an opening 24 between metallization 18 and second dielectric layer 20 that extends all the way down to contact plug 14.

Those skilled in the art will recognize that depositing metallization layer 18 in a dogbone formation to prevent the formation of opening 24 is undesired because metallization in dogbone formation consumes significantly larger area on the substrate surface and thereby reduces the number of die formed on a semiconductor wafer.

Via hole 22 then undergoes post-etch cleaning using the post-etch cleaning solution, as described above, to remove the etch residue present at the side-walls of the via hole. Next, an adhesion layer, a barrier layer and a tungsten layer may be deposited on the partially fabricated IC surface and undergo chemical-mechanical polishing to form a via plug, which connects one metallization layer to another metalization layer of an IC. Those skilled in the art will recognize that these steps are followed by similar steps, e.g., depositing and patterning additional metallization layers, post-etch cleaning, depositing additional dielectrice layers, until the IC fabrication is completed.

Unfortunately, the above described process suffers from several drawbacks. By way of example, some of the post-etch cleaning solution composition may remain in the contact hole and via hole, gradually corroding the metal plug, i.e. contact or via plug, formed subsequently. The metal plug, therefore, does not effectively connect the device elements to the first metallization layer or connect one metallization layer to another metallization layer, causing catastrophic device failure.

As another example, during post-etch cleaning of the via hole, opening 24 between the metallization layer 18 and dielectric layer 20 provides the post-etch cleaning solution a pathway to migrate or seep into the underlying contact plug. As a result, over a period of time, the metal, e.g., tungsten, aluminum or copper, composition in the contact plug reacts with the post-etch cleaning solution and is gradually depleted and/or corroded, which may also lead to catastrophic device failure.

As yet another example, during post-etch cleaning of the patterned metallization, some of the post-etch cleaning solvent migrates into the underlying plug throb cracks or fissures formed in the metallization layer during deposition, patterning, etc. of the metallization layer. In other instances, the post-etch cleaning solvent collects or is trapped in the fissures and cracks of the metallization layer and reacts with the metallization layer over a period of time to create pathways that ultimately lead the solvent to the underlying plug, where plug corrosion begins.

What is therefore needed is a corrosion sensitive structure or process of monitoring the corrosion of contact and via plugs in ICs, which process effectively simulates the gradual process of corrosion of contact and via plugs.

SUMMARY OF THE INVENTION

To achieve the foregoing, the present invention provides a die including a corrosion monitoring feature. The die includes: (i) a surface including an active die region and a scribeline region that is adjacent the active die region; (ii) an insulating layer disposed above the surface and includes a first corrosion sensitive metal plug and a second corrosion sensitive metal plug in the scribeline region; and (iii) a metallization layer positioned above the insulating layer, the first corrosion sensitive metal plug and the second corrosion sensitive metal plug in the scribeline region and the metallization layer disposed above second corrosion sensitive metal plug is patterned to provide the metallization layer with a first opening extending from a top surface of the metallization layer down to a top surface of the second corrosion sensitive metal plug such that a solvent introduced above the top surface of the metallization layer flows into the second corrosion sensitive metal plug disposed below through the first opening in the metallization layer.

The corrosion sensitive metal plug may be a corrosion sensitive contact plug or a corrosion sensitive via plug. A length and a width of the first and the second corrosion sensitive metal plugs may be between about 3 and about 5 $\mu$m. A depth of the first and second corrosion sensitive metal plugs may be between about 5000 and about 10000 Angstroms.

A length of the first opening in the metallization layer may be between about 3 $\mu$m and about 5 $\mu$m and a width of the first opening in the metallization layer may be between about 0.2 and about 0.4 $\mu$m. A depth of the first opening in the metallization layer may be between about 4000 and about 8000 Angstroms.

The die of the present invention may further include a third corrosion sensitive metal plug and a fourth corrosion sensitive metal plug formed in the scribeline region and a portion of the metallization layer disposed above the third and fourth corrosion sensitive metal plugs is patterned to have defined thereon a second opening and third opening, which openings extend from the top surface of the metallization layer down to a top surface of the third and fourth corrosion sensitive metal plugs, respectively, disposed below such that a solvent introduced above a surface of the metallization layer can flow down into the third and fourth corrosion sensitive metal plugs through the second and third opening respectively. The metallization layer may have two of the first opening, three of the second opening and five of the third opening.

In another aspect, the present invention provides a semiconductor wafer including a corrosion monitoring feature. The semiconductor wafer may include (i) a surface including an active die region and a scribeline region that is adjacent the active die region; (ii) an insulating layer disposed above the surface and includes a first corrosion sensitive metal plug and a second corrosion sensitive metal plug in the scribeline region; and (iii) a metallization layer positioned above the insulating layer, the first corrosion sensitive metal plug and the second corrosion sensitive metal plug in the scribeline region and the metallization layer disposed above second corrosion sensitive metal plug is patterned to provide the metallization layer with a first opening extending from a top surface of the metallization layer down to a top surface of the second corrosion sensitive metal plug such that a solvent introduced above the top surface of the metallization layer flows into the second corrosion sensitive metal plug disposed below through the first opening in the metallization layer.

The insulating layer may include a silicon dioxide layer. The first and second corrosion sensitive metal plugs may include tungsten or aluminum. A length and a width of the first and the second corrosion sensitive metal plugs may be between about 3 and about 5 $\mu$m. A depth of the first and the second corrosion sensitive metal plugs may be between about 5000 and about 10000 Angstroms. A length of the first opening in the metallization layer may be between about 3 $\mu$m and about 5 $\mu$m. A width of the first opening in the metallization layer may be between about 0.2 and about 0.4 $\mu$m. A width of the first opening in the metallization layer is about 0.3 $\mu$m. A depth of the first opening in the metallization layer may be about 4000 and about 8000 Angstroms. The metallization above the second corrosion sensitive metal plug may include two of the first openings.

According to one embodiment, the second corrosion sensitive metal plug of the present invention is a corrosion sensitive contact plug and the semiconductor wafer further includes: (i) a transistor device formed in the active die and scribeline regions; (ii) a contact plug formed in the insulating layer that is deposited in the active die region and the metallization layer being positioned above the contact plug in the active die region and corrosion sensitive contact plug in the scribeline region such that the contact plug region and corrosion sensitive contact plug provide electrically conductive pathways between the metallization layer and the transistor device in the active die region and between the metallization layer and transistor device in the scribeline region, respectively. The transistor device may include source and drain diffusion regions and gate electrode.

The semiconductor wafer of the present invention may further include: (i) a third corrosion sensitive metal plug and a fourth corrosion sensitive metal plug formed in the scribeline region and a portion of the metallization layer disposed above the third corrosion sensitive metal plug is patterned to have defined thereon a second opening that extends from the top surface of the metallization layer down to a top surface of the third corrosion sensitive metal plug disposed below such that a solvent introduced above a surface of the metallization layer can flow down into the third corrosion sensitive metal plug through the second opening and the a portion of the metallization layer disposed above the fourth corrosion sensitive metal plug is patterned to have defined thereon a third opening that extends from the top surface of the metallization layer down to a top surface of the fourth corrosion sensitive metal plug disposed below such that a solvent introduced above a surface of the metallization layer can flow down into the fourth corrosion sensitive metal plug through the third opening.

The metallization layer may have three of the second opening and five of the third opening. The metallization layer may be a second metallization layer, the insulating layer may be a dielectric layer and the first and second corrosion sensitive metal plugs may be a first and a second corrosion sensitive via plug, respectively, formed in the dielectric layer, the semiconductor wafer may further include a first metallization layer disposed below the dielectric layer and the first and the second corrosion sensitive via plug such that the first and the second corrosion sensitive via plug provide an electrically conductive pathway between the first and the second metallization layer.

The metallization layer may be a second metallization layer, the insulating layer may be a dielectric layer and the first and the second corrosion sensitive metal plug are a first and a second corrosion sensitive via plug, respectively, formed in the dielectric layer, the semiconductor wafer may further include a first metallization layer disposed below said dielectric layer and said first and said second corrosion sensitive via plug such that said first and said second corrosion sensitive via plug provide electrically conductive pathways between said first and said second metallization layer.

In one embodiment, the semiconductor wafer of the present invention may further include: (i) a first conductive chain connecting a first series of said first corrosion sensitive metal plugs and a second conductive chain connecting a second series of said second corrosion sensitive metal plugs; (ii) a first and a second top probe pad defined on the metallization layer near a top portion of said first and said second series and connected to said first and said second conductive chain, respectively; and (iii) a first and a second bottom probe pad defined on the metallization layer near a bottom portion of said first and said second series and connected to said first and said second conductive chain, respectively.

In this embodiment, the first and the second sensitive corrosion metal plug are corrosion sensitive via plugs and in the first and the second conductive chain, some of the first and the second corrosion sensitive via plugs located adjacent to each other are in the first and the second series connected by the metallization layer and other said first and the second corrosion sensitive via plugs located adjacent to each other in the first and the second series are connected by another metallization layer that is disposed below the metallization.

Alternatively, the first and the second sensitive corrosion metal plug are a first and a second corrosion sensitive contact plugs, respectively, and some of said first and said second corrosion sensitive contact plug located adjacent to each other in the first and the second series are connected by the metallization layer and other said first and said second corrosion sensitive contact plugs located adjacent to each other in the first and the second series are connected by diffusion regions formed on the semiconductor wafer surface.

In yet another aspect, the present invention provides a process of forming a semiconductor wafer including a corrosion monitoring feature. The process includes: (i) defining on a surface of the semiconductor substrate an active die region and a scribeline region that is adjacent the active die region; (ii) depositing an insulating layer above the semiconductor substrate surface; (iii) forming a first and a second corrosion sensitive metal plugs in the insulating layer in the scribeline region; and (iv) depositing and patterning a metallization layer above the insulating layer, the first and the second corrosion sensitive metal plugs in the scribeline region such that the metallization layer above the second corrosion sensitive metal plug includes a first opening that extends from a top surface of the metallization layer down to a top surface of the second corrosion sensitive metal plug so that a liquid introduced above the top surface of the metallization layer flows into the second corrosion sensitive metal plug.

The process may further include forming a third and a fourth corrosion sensitive metal plug in the insulating layer in the scribeline region and the step of patterning includes patterning the metallization layer above the third and the fourth corrosion sensitive metal plug in the scribeline region such that the metallization layer above the third corrosion sensitive metal plug includes a second opening and the metallization layer above the fourth corrosion sensitive metal plug includes a third opening, the second and the third opening extend from the top surface of the metallization layer down to a top surface of the third corrosion sensitive metal plug and a top surface of the fourth corrosion sensitive metal plug, respectively, so that a solvent introduced above the top surface of the metallization layer flows into the third corrosion sensitive metal plug through the second opening and flows into the fourth corrosion sensitive metal plug through the third opening.

There may be two of the first opening, three of the second opening and five of the third opening. In the step of forming the first and second corrosion sensitive metal plugs, the metal plugs may be corrosion sensitive contact plugs and the process may further include forming on the semiconductor surface diffusion region that are connected to the patterned metallization layer by the first and the second corrosion sensitive contact plugs.

In the step of forming the first and second corrosion sensitive metal plugs, the metallization layer is a second metallization layer, the insulating layer is a dielectric layer and the first and the second corrosion sensitive metal plug are a first and a second corrosion sensitive via plug, respectively, formed in the dielectric layer, the process further includes depositing and patterning a first metallization layer disposed below the dielectric layer and the first and the second corrosion sensitive via plug such that the first and the second corrosion sensitive via plug provide an electrically conductive pathway between the first and the second metallization layers.

In one embodiment of the present invention, the metal plugs are corrosion sensitive contact plugs and a first series of a plurality of the first corrosion sensitive contact plugs and a second series of a plurality of second corrosion sensitive contact plugs are formed and the metallization layer is patterned to: (i) define a first top probe pad near a top portion of the first series of the first corrosion sensitive contact plugs and a first bottom probe pad near a bottom portion of the first series of the first corrosion sensitive contact plugs and define a second top probe pad near a top portion of the second series of the second corrosion sensitive contact plugs and a second bottom probe pad near a bottom portion of the second series of corrosion sensitive contact plugs, (ii) connect some of the first corrosion sensitive contact plugs located adjacent to each other in the first series to form a portion of a first conductive chain and connect some of the second corrosion sensitive contact plugs located adjacent to each other in the second series to form a portion of a second conductive chain, the first conductive chain extends from the first top probe pad to the first bottom probe pad and the second conductive chain extends from the second top probe pad to the second bottom probe pad, and (iii) connect the first conductive chain to the first top probe pad and to the first bottom probe pad and connect the second conductive chain to the second top probe pad and to the second bottom probe pad; and the process further includes forming on the semiconductor surface diffusion regions that are connected to the metallization layer by the first and the second series of corrosion sensitive contact plugs and the diffusion regions connect some of the first corrosion sensitive contact plugs located adjacent to each other in the first series to form another portion of the first conductive chain and connect some of the second corrosion sensitive contact plugs located adjacent to each other in the second series to form another portion of the second conductive chain.

In another embodiment of the present invention, the metal plugs are corrosion sensitive via plugs and a first series of a plurality of the first corrosion sensitive via plugs and a second series of a plurality of second corrosion sensitive via plugs are formed and the metallization layer is a second metallization layer and patterned to: (i) define a first top probe pad near a top portion of the first series of the first corrosion sensitive contact plugs and a first bottom probe pad near a bottom portion of the first series of the first corrosion sensitive via plugs and define a second top probe pad near a top portion of the second series of the second corrosion sensitive via plugs and a second bottom probe pad near a bottom portion of the second series of the second corrosion sensitive via plugs, (ii) connect some of the first corrosion sensitive via plugs located adjacent to each other in the first series to form a portion of a first conductive chain that extends from the first top probe pad to the first bottom probe pad and connect some of the second corrosion sensitive via plugs located adjacent to each other in the second series to form a portion of a second conductive chain that extends from the second top probe pad to the second bottom probe pad, and (iii) connect the first conductive chain to the first top probe pad and to the first bottom probe pad and connect the second conductive chain to the second top probe pad and to second bottom probe pad; and the process further includes the step of forming on the semiconductor surface a first metallization layer disposed below the insulating layer and the first and the second series of corrosion sensitive via plugs, the first metallization layer is connected to the second metallization layer by the first and the series of corrosion sensitive via plugs and the first metallization layer connects some of the first corrosion sensitive via plugs located adjacent to each other to form another portion of the first conductive chain and connects some of the second corrosion sensitive via plugs located adjacent to each other in the second series to form another portion of the second conductive chain.

In this embodiment, the process may further include: (i) connecting the first and the second top probe pads to a power source and the first and second bottom probe pads to ground voltage; (ii) energizing the first and the second top probe pads; and (iii) measuring the resistance of the first and the second conductive chains. The process may further still include a step of characterizing effects on the first and second conductive chains when the chains are exposed to a post-etch cleaning solution; and monitoring the resistance of the first and the second conductive chains.

These and other features of the present invention will be described in more detail below in the detailed description of the invention and in conjunction with the following figures.

DETAILED DESCRIPTION OF THE PREFERRED EMBODIMENTS

The present invention provides corrosion sensitive structures for vias and contact plugs in integrated circuits (ICs). In the following description, numerous specific details are set forth in order to fully illustrate a preferred embodiment of the present invention. It will be apparent, however, that the present invention may be practiced without limitation to some specific details presented herein. By way of example, contact or via plugs of the present invention may be filled with other metals or conductive materials, besides tungsten, such as aluminum and copper.

Figure 1:
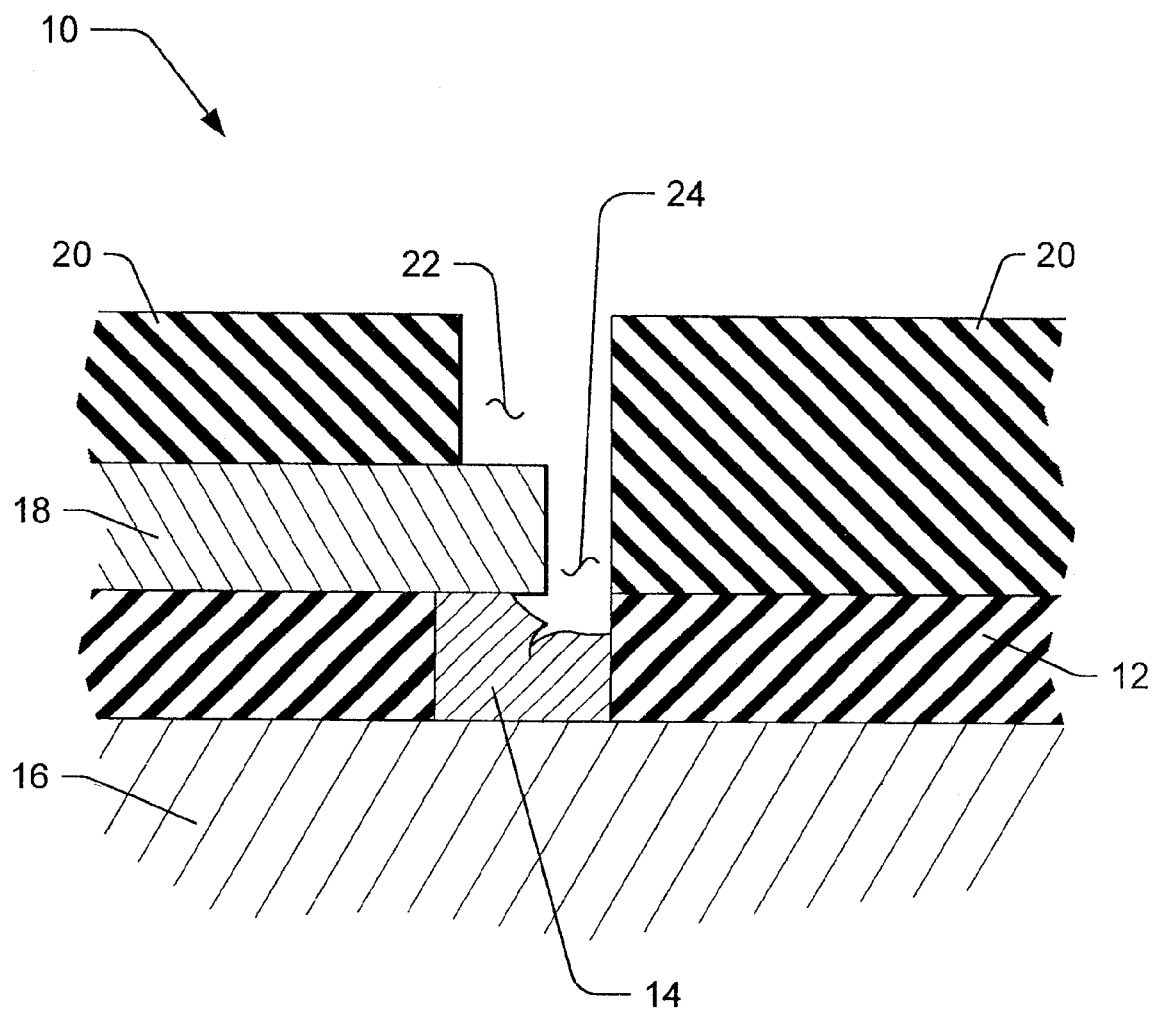
FIG. 1 shows a cross-sectional view of a partially fabricated integrated circuit (IC) that undergoes corrosion due to the current post-etch cleaning processes.
Figure 2:
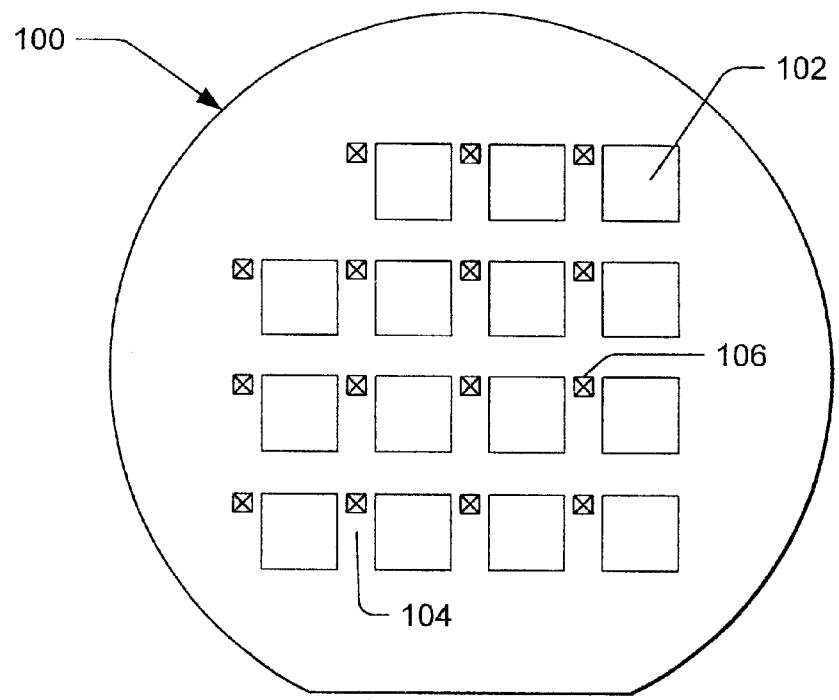
FIG. 2 shows a top view of a semiconductor wafer surface including active die regions and scribeline regions where corrosion sensitive structures according to the present invention are formed.

The corrosion sensitive structures, according to the present invention, are formed in a scribeline region of a semiconductor wafer surface during die fabrication. FIG. 2 shows a semiconductor wafer surface 100 including a scribeline region 104 adjacent an active die region or a region that includes a die 102. Corrosion sensitive structures 106 of the present invention are formed in scribeline region 104. As it well known to those skilled in the art, scribeline is a small avenue of space between die and separate the die from each other. After the conclusion of die fabrication, the semiconductor wafer is typically cut into several units of die or chips by cutting along a line in scribeline region 104. Furthermore, as a result of conventional semiconductor substrate processing, scribeline region 104 may include transistor device parametric testing features for monitoring the transistor device parameters, e.g., device performance and speed. These features, however, do not include features for monitoring the corrosion process of metal plugs (e.g., contact plugs and via plugs), much less simulate the gradual nature of the corrosion process described by the present invention.

The present invention equips a semiconductor wafer, for example, with corrosion monitoring features adjacent the active die area that effectively simulate the gradual corrosion process of metal plugs in the active die area. The corrosion monitoring features, according to the present invention, described below may be formed in the scribeline region along with the conventionally formed transistor device parametric testing features, mentioned above.

Figure 3:
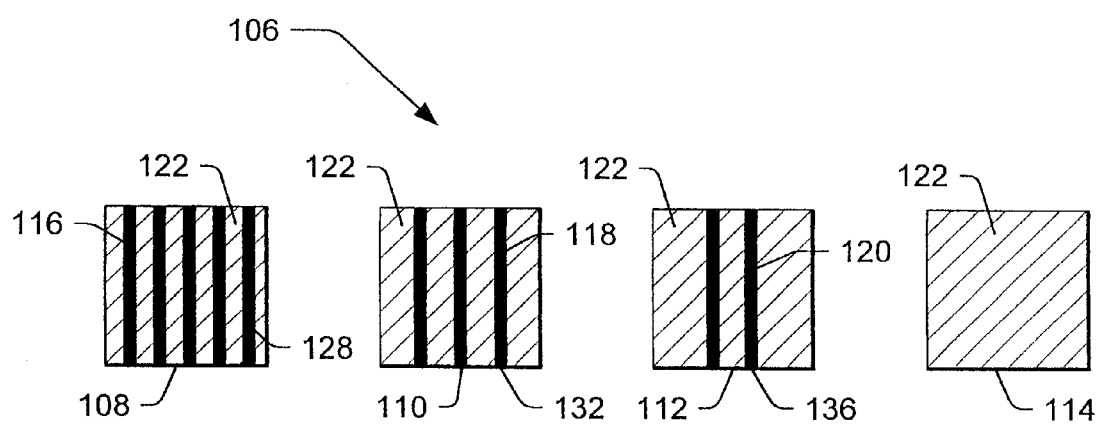
FIG. 3 shows a top view of a collection of corrosion sensitive structures, according to a preferred embodiment of the present invention.

FIG. 3 shows in detail a top view of a collection of corrosion sensitive structures 106 of FIG. 2, according to a preferred embodiment of the present invention. In this embodiment, corrosion sensitive structures 106 include four corrosion sensitive structures 108, 110, 112 and 114. Corrosion sensitive structures 108, 110 and 112 include different number of distinct openings or apertures 116, 118 and 120 (shown as boundaries of darkened slits) defined on a metallization layer 122. By way of example, FIG. 3 shows five of opening 116, three of opening 118 and two of opening 120 defined on metallization layer 122. Corrosion sensitive structure 114, however, does not have an opening defined on metallization layer 122.

Openings 116, 118 and 120 provide a liquid, e.g., a post-etch cleaning solvent introduced on a top surface of metallization layer 122 during a post-etch cleaning step, pathways from a top surface of metallization layer 122 into the underlying corrosion sensitive plugs 128, 132, 136 (shown as darkened slits), respectively. In the case of corrosion sensitive structure 114, however, the solvent is not provided with a discrete pathway to access the underlying corrosion sensitive plug (not shown to simplify illustration). As will be explained later, corrosion sensitive structure 114 serves as a control corrosion sensitive structure.

Figure 4A:
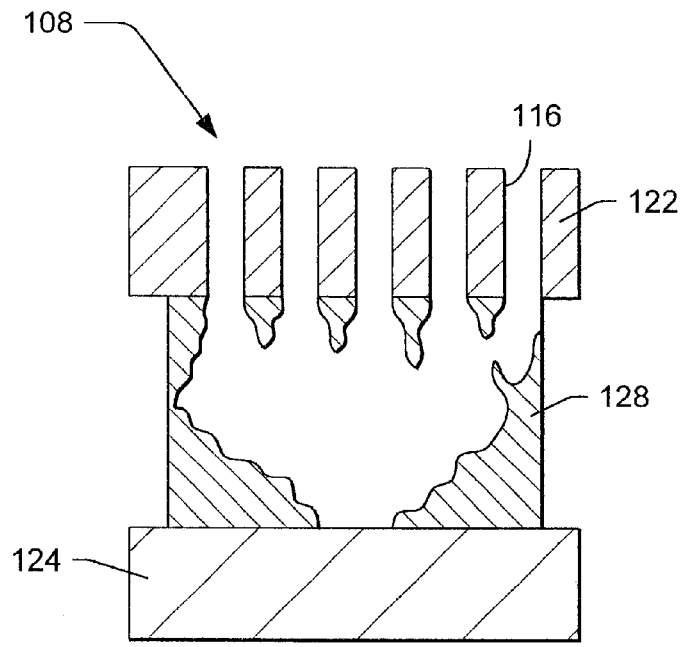
FIGS. 4A–4D show cross-sectional views of corrosion sensitive structures of FIG. 3.
Figure 4B:
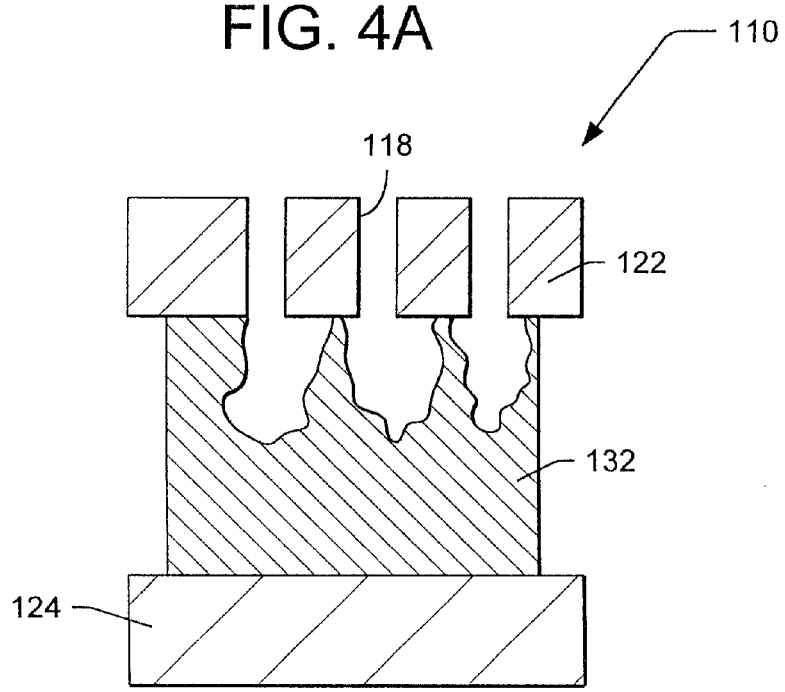
Figure 4C:
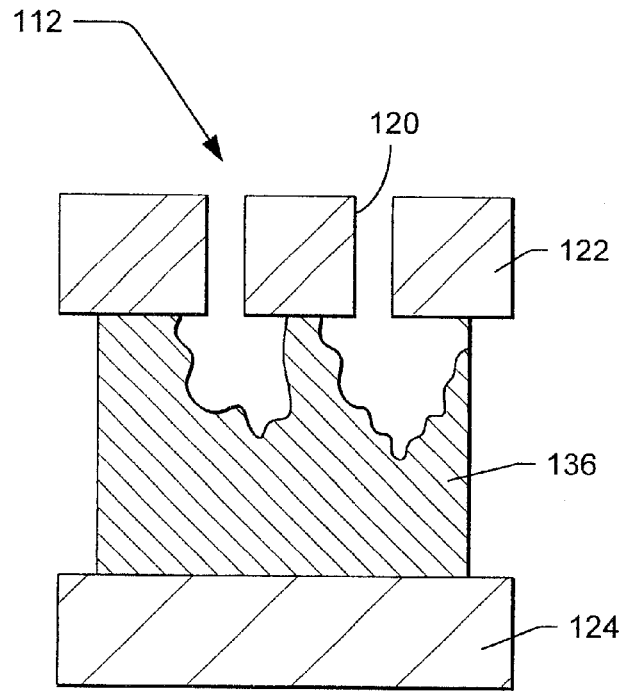
Figure 4D:
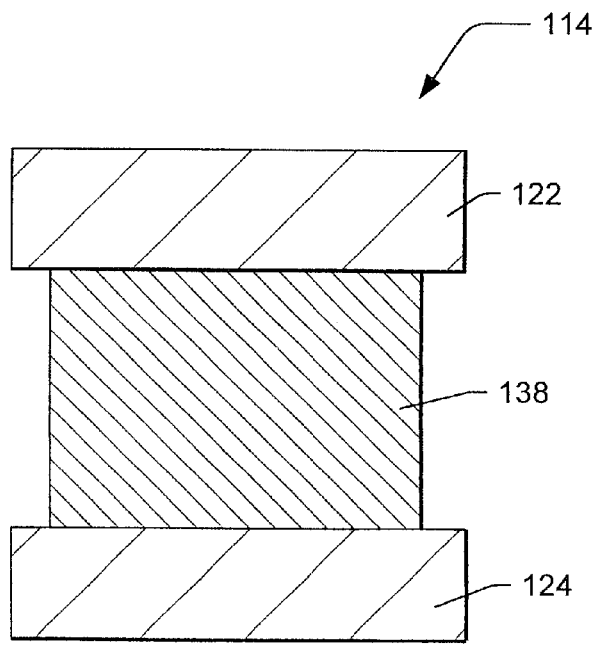

FIGS. 4A–4D show cross-sectional views of corrosion sensitive structures 108, 110, 112 and 114 of FIG. 3. FIG. 4A shows that corrosion sensitive structure 108 includes a corrosion sensitive via plug 128 sandwiched between a first metallization layer 124 and a second metallization layer 122. Furthermore, patterned second metallization layer 122 has defined thereon five distinct openings 116 that extend from a top surface of second metallization layer 122 to a top surface of corrosion sensitive plug 128. Those skilled in the art will recognize that a corrosion sensitive contact plug is sandwiched between diffusion regions, e.g., source/drain or gate electrode of a transistor device, and the first metallization layer, which is patterned to form similar openings. FIGS. 4B and 4C show structures similar to FIG. 4A, except FIG. 4B shows three of opening 118 and FIG. 4C shows two of opening 120. FIG. 4D shows corrosion sensitive plug 138 that connects first metallization layer 122 and second metallization layer 124, which has no openings.

Corrosion sensitive plugs of FIGS. 3 and 4A–4D have appropriate dimensions such that all the openings defined in the overlying metallization layer 122 are in communication with the corrosion sensitive via plug. In a preferred embodiment, however, the openings have a length and a width that is between about 3 and about 5 μm and a depth of between about 5000 and about 10000 Angstroms.

Opening or apertures of FIGS. 3 and 4A–4D have appropriate dimensions to serve as pathways for the solvent from the top surface of metallization layer 122 into the corrosion sensitive via plug. A length of the opening is preferably substantially similar to the length of the underlying metal plug. By way of example, for a metal plug where the length varies between about 3 and about 5 μm, the opening also has a length that is between about 3 and about 5 μm. The width of the opening is preferably between about 0.2 and about 0.4 μm and we preferably about 0.3 μm. The depth of the opening generally equals the thickness of the metallization layer in which the opening is defined. The depth of the opening is preferably between about 4000 and about 8000 Angstroms.

Corrosion sensitive structures of the present invention span from a structure like the one shown in FIG. 4A (including five openings in the metallization layer) that is most likely to corrode to a structure like the one shown in FIG. 4D (having no opening in the metallization layer) that is least likely or unlikely to corrode. The corrosion sensitive structures of FIG. 4B (including three openings in the metallization layer) and 4C (including two openings in the metallization layer) are the second and third most likely corrosion sensitive structures to corrode, respectively. It is important to note that a greater number of openings in a corrosion sensitive structure makes a higher amount of solvent available in the corrosion sensitive plug to react with the plug composition and is therefore is more likely to corrode to a greater extent or even fail, i.e. the corrosion sensitive plug no longer electrically connects two metallization layers or connects a metallization layer and transistor device's diffusion region. In other words, there is a decrease in the amount of depletion of the plug composition due to corrosion as the number of openings decrease, as shown in FIGS. 4A–4D.

It is believed that as the post-etch cleaning reacts with and depletes the metal plug composition in the active die region over a period of time, it carves out a pathway that makes more of the solvent available to the plug composition. As a result, over a period of time more and more of these pathways are formed inside the metal plug and the degree of corrosion of the metal plug is intensified. The variation in the number of openings in corrosion sensitive structures 108, 110, 112, therefore, effectively simulates the gradual corrosion process of metal plugs. To this end, corrosion sensitive structure 114, which is substantially similar to a metal plug in the active die region before corrosion begins, acts like a control structure.

Figure 5:
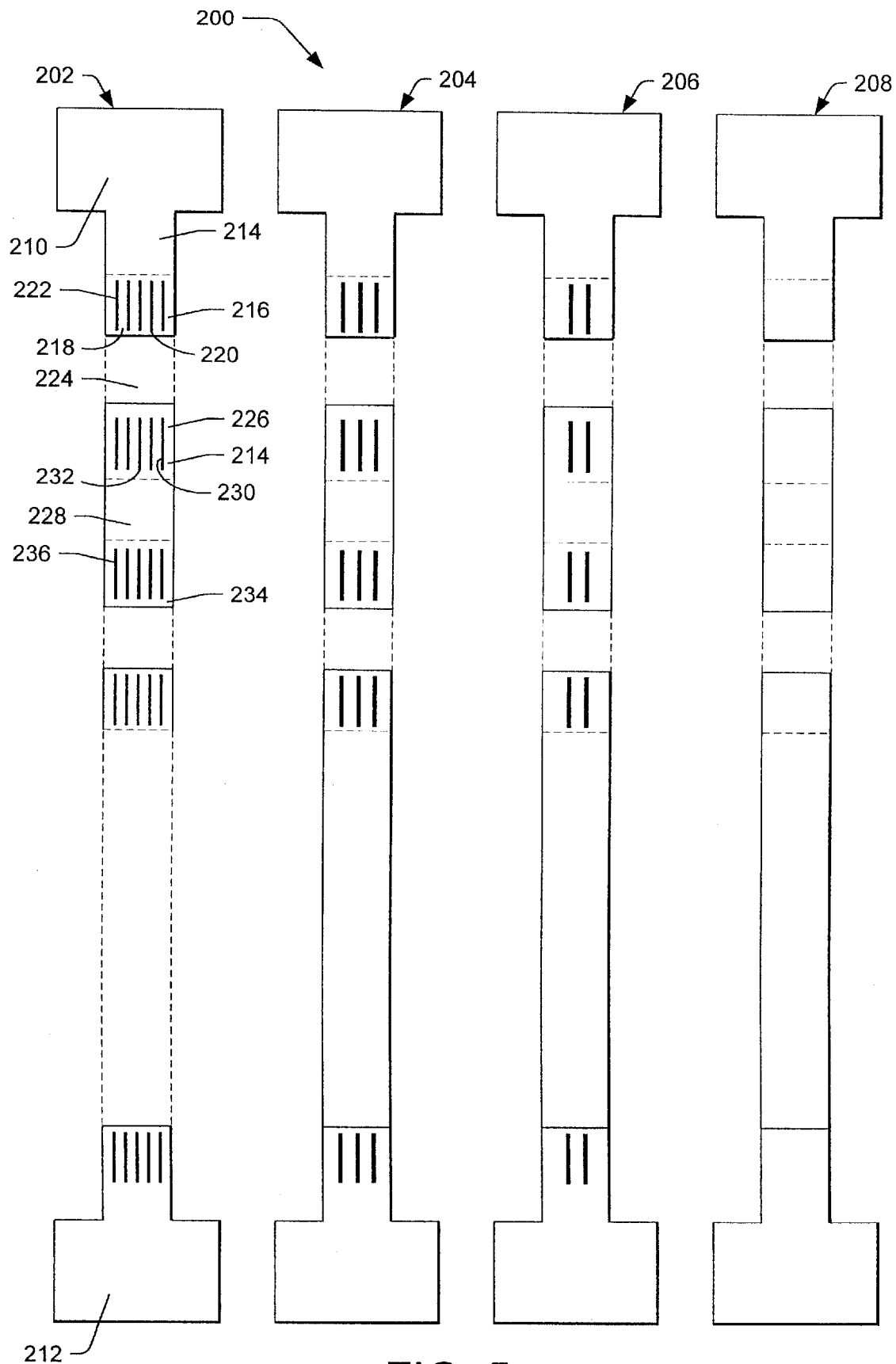
FIG. 5 shows conductive chains of corrosion sensitive via plugs, according to one embodiment of the present invention, for monitoring the resistance of corrosion sensitive via plugs of the present invention.

FIG. 5 shows a corrosion monitoring feature 200, according to a preferred embodiment of the present invention, formed in the scribeline region of a semiconductor wafer surface, e.g., semiconductor surface 100 of FIG. 2, that includes conductive chains 202, 204, 206 and 208 of corrosion sensitive metal plugs. These term "conductive chain," as used herein, refers to a conductive pathway formed as described below that connects a series of a particular type of corrosion sensitive structures. By way of example, a plurality of corrosion sensitive structure 108 are connected by conductive chain 202.

As shown in the embodiment of FIG. 5, conductive chains 202, 204, 206 and 208 are substantially similar in structure, except the number of openings in the corrosion sensitive structure are different. By way of example, conductive chain 202 connects a series of corrosion sensitive structures including five openings that are formed along a line. Similarly, conductive chains 204, 206 and 208 connect a series of corrosion sensitive plugs including three, two and no openings, respectively. It is important to note that a series of corrosion sensitive structures with the same number of openings and formed along the same line (e.g., aligned in the column space adjacent the die) may be connected to form a conductive chain.

FIG. 5 shows that conductive chain 202 provides a single conductive pathway extending from a top probe pad 210 that may be disposed near the top of the semiconductor wafer surface to a bottom probe pad 212 that may be disposed near the bottom of the semiconductor surface and connecting a series of corrosion sensitive metal via plugs 222 and 232 and the like on the conductive path. A second metallization layer 214 is patterned such that top probe pad 210 is electrically connected to a portion of second metallization layer 218 that is part of the corrosion sensitive structure 216. Second metallization layer 218 is patterned to have defined thereon openings 220 that provide a solvent access to an underlying corrosion sensitive via plug 222, which connects the overlying portion of second metallization layer 218 and a first metallization layer 224 (shown by phantom lines in FIG. 5) that is disposed below corrosion sensitive plug 222. First metallization layer 224 is patterned such that corrosion sensitive via plugs 222 and 232 are connected at this level. Corrosion sensitive plug 232 connects first metallization layer 224 and second metallization layer 214, which is patterned and has defined thereon openings 230 to form another corrosion sensitive structure 226. A portion of patterned second metallization layer 214 shown by reference number 228 electrically connects corrosion sensitive structures 226 and 234 or connects corrosion sensitive via plugs 232 and 236. Corrosion sensitive structure 234, like corrosion sensitive structure 216, connects to the next corrosion sensitive structure at the first metallization level.

According to FIG. 5, the first adjacent corrosion sensitive structures 216 and 226 are connected at the first metallization level and the next adjacent corrosion sensitive structures 226 and 234 are connected at the second metallization level. In this manner, an entire chain connecting a series of corrosion sensitive via plugs is formed. Those skilled in the art will recognize that a conductive chain of contact plugs is similarly formed, except the corrosion sensitive contact plugs connect the first metallization layer to transistor device diffusion regions, e.g., source/drain or gate electrode.

A process of forming conductive chain 202 including corrosion sensitive structures, e.g., corrosion sensitive structures 106 of FIG. 3 and corrosion sensitive structures 216 and 226 shown in FIG. 5, includes performing conventional die fabrication steps in the scribeline region as they are performed in the active die region. By way of example, transistor device diffusion regions, e.g., source/drain and gate electrodes may be formed in the active die and scribeline regions simultaneously. An insulating layer, e.g., a layer of silicon dioxide, is blanket deposited on the semiconductor wafer surface and etched using conventional photolithography techniques to form contact holes in the active die and scribeline regions. The wafer surface then undergoes cleaning using a post-etch cleaning solvent as described above.

In the scribeline region, at least one contact hole may be dedicated to forming a corrosion sensitive structure with at least one opening and one contact hole is dedicated to forming the corrosion sensitive control structure with no openings, e.g. corrosion sensitive structure 114 of FIGS. 3 and 4D. As mentioned before, in a preferred embodiment, however, the scribeline region of the present invention includes four corrosion sensitive structures next to each other as shown in FIG. 3.

Next, contact plugs and corrosion sensitive contact plugs are formed in the insulating layer in active die regions and scribeline regions, respectively, according to conventional techniques well known to those skilled in the art. A first metallization layer is then deposited and patterned in both the active die and scribeline regions to form the interconnects at this level. Furthermore, the first metallization, in the scribeline region, disposed above at least one corrosion sensitive structure is also patterned to define at least one opening, e.g., like openings 116, 118 and 120 shown in FIG. 3. A reticle employed during conventional photolithography includes at the appropriate places the images of the openings, which are ultimately transferred to the wafer surface before etching and after etching the wafer undergoes post-etch cleaning as described above. Further still, in the scribeline region, the first metallization layer also connects some of adjacent corrosion sensitive contact plugs (having the same number of openings) to form a portion of the conductive chain of contact plugs as described above in the discussion referencing FIG. 5.

A first interlayer dielectric (also known as "ILD1") is deposited and etched, according to conventional methods, to form via holes in the active die and scribeline regions. Next, via plugs are formed in the active die region and corrosion sensitive via plugs are formed in the scribeline region. A second metallization layer is deposited and patterned to: (i) form interconnects at this level; (ii) form at least one opening above at least one of the corrosion sensitive via plugs in the scribeline region; and (iii) connect some of adjacent corrosion sensitive via plugs to form a portion of the conductive chain of via plugs shown in FIG. 5 and described above. Those skilled in the art will recognize that steps similar to the steps described above follow until the die structure on the wafer surface is completely fabricated.

During wafer sort, corrosion testing, according to one embodiment of the present invention, begins after top probe pad 210 of FIG. 5 is connected to a power source and bottom probe pad 212 is connected to ground voltage. Next, top probe pad 210 is energized and the resistance of conductive chain 202 is measured using techniques and principles well known to those skilled in the art. The resistances of conductive chains 204, 206 and 208 are also measured simultaneously or shortly thereafter.

According to one embodiment of the present invention, the resistances of conductive chains 202, 204, 206 and 208 are collectively monitored (on a daily basis, for example) over a period of time to provide insight into the extent of corrosion that may have taken place inside the contact and via plugs in the active die region. It is expected that conductive chain 202 connecting the series of corrosion sensitive structures with five openings will have the highest resistance relative to conductive chains 204, 206 and 208. It is believed that more openings allow a higher amount of the post-etch cleaning solvent to react with and deplete the plug composition and therefore less surface area in the plug is available for connecting two metallization layers, for example. In other words, the resistance of a conductive chain is expected to be higher, if the number of openings in corrosion sensitive structures of a conductive chain increased. Consistent with this principle, conductive chain 204 and then conductive chain 206 are expected to have the next highest resistances and conductive chain 208 will have the lowest resistance of the four conductive chains.

In the event the resistance measurement is higher from the expected range of resistance for a particular conductive chain, additional testing may be performed to determine the extent of corrosion in the plugs of active die region or the entire wafer lot may be rejected due to unreliability. An anomaly in the resistance measurement when compared to the expected range of resistance of the conductive chain may provide information on the probability that a certain number of plugs in the active die region may suffer from corrosion that could eventually lead to device failure. By way of example, if the resistance measurement of conductive chain 204 is uncharacteristically high, then depending on the die design it may be estimated that two out of 10 million vias in the active die region have a structure similar to the corrosion sensitive plug of conductive chain 204 and there is a high (about 90% or higher) probability that the two vias will eventually corrode and cause device failure. Those skilled in the art will recognize that empirical expressions can be developed that provide a set of probability values for a certain number of vias or contact plugs out of total number of vias in an active die region that will cause device failure.

It is important to note that although it is not necessary, but preferable, to have four conductive chains as described above to simulate the gradual process of corrosion, in embodiment, the scribeline region according to the present invention may include two conductive chains, one of which connects a series of corrosion sensitive structures with at least one opening and another conductive chain connects a series of control corrosion sensitive structures (with no openings). In this embodiment, the resistance of one conductive chain is measured and compared to the resistance measurement of the conductive chain including the control structures.

Those skilled in the art will recognize that based on the resistance measurements of the conductive chains, a profile of the plug composition in a corrosion sensitive plug may be estimated and such profiles generated over a period of time provide information on the extent of corrosion that may be taking place in the active die region.

In order to estimate the plug composition profile and perform a probability analysis, various empirical studies (mentioned above) are conducted that correlate the profile of the metal plug composition and the defect rate of the corrosion sensitive structures in the conductive metal plug chain. Basically, experiments are conducted to characterize the corrosion sensitive structures and a history of how a post-etch cleaning solution effects corrosion sensitive structures in the conductive metal plug chains is established. By way of example, results from burn-in and reliability studies, which are well known to those skilled in the art, may be used to develop the correlation mentioned above. Based on the results of these studies or history of behavior, the profile of the metal plug composition and probability values mentioned above may be determined.

In one embodiment of the present invention, after corrosion testing has concluded and the wafers have passed the corrosion tests described above, the conductive chains described above are removed when the die are cut along the scribeline area to form die or semiconductor chips. According to an alternative embodiment, however, the corrosion sensitive structure next to the die is preserved when the die are cut into chips so that resistance measurements may be made on the corrosion sensitive structures using manual probing techniques.

Although the foregoing invention has been described in some detail for purposes of clarity of understanding, it will be apparent that certain changes and modifications may be practiced within the scope of the appended claims. For example, while the specification describes forming these corrosion sensitive structures in semiconductor wafers, there is no reason why in principle such structures cannot be formed in other integrated circuits (ICs). Therefore, the present embodiments are to be considered as illustrative and not restrictive, and the invention is not to be limited to the details given herein, but may be modified within the scope of the appended claims.

What is claimed is:

1. A die including a corrosion monitoring feature, comprising:
a surface including an active die region and a scribeline region that is adjacent said active die region;
an insulating layer disposed above said surface and includes a first corrosion sensitive metal plug and a second corrosion sensitive metal plug in said scribeline region; and
a metallization layer positioned above said insulating layer, wherein said first corrosion sensitive metal plug and said second corrosion sensitive metal plug in said scribeline region and said metallization layer disposed above said second corrosion sensitive metal plug are patterned to provide said metallization layer with a first opening extending for a top surface of said metallization layer down to a top surface of said second corrosion sensitive metal plug such that a solvent introduced above said top surface of said metallization layer flows into said second corrosion sensitive metal plug disposed below through said first opening in said metallization layer.

2. The die of claim 1, wherein the first and second corrosion sensitive metal plugs are corrosion sensitive contact plugs or corrosion sensitive via plugs.

3. The die of claim 1, wherein a length and a width of the first and the second corrosion sensitive metal plugs are between about 3 and about 5 $\mu$m.

4. The die of claim 1, wherein a depth of the first and the second corrosion sensitive metal plugs is between about 5000 and about 10000 Angstroms.

5. The die of claim 1, wherein a length of said first opening in said metallization layer is between about 3 $\mu$m and about 5 $\mu$m.

6. The die of claim 1, wherein a width of said first opening in said metallization layer is between about 0.2 and about 0.4 $\mu$m.

7. The die of claim 1, wherein a depth of said first opening in said metallization layer is between about 4000 and about 8000 Angstroms.

8. The die of claim 1, further comprising:
a third corrosion sensitive metal plug and a fourth corrosion sensitive metal plug formed in said scribeline region and a portion of said metallization layer disposed above said third corrosion sensitive metal plug is patterned to have defined thereon a second opening that extends from said top surface of said metallization layer down to a top surface of said third corrosion sensitive metal plug disposed below such that a solvent introduced above a surface of said metallization layer can flow down into said third corrosion sensitive metal plug through said second opening and a portion of said metallization layer disposed above said fourth corrosion sensitive metal plug is patterned to have defined thereon a third opening that extends from said top surface of said metallization layer down to a top surface of said fourth corrosion sensitive metal plug disposed below such that a solvent introduced above a surface of said metallization layer can flow down into said fourth corrosion sensitive metal plug through said third opening.

9. The die of claim 8, wherein said metallization layer has two of said first opening, three of said second opening and five of said third opening.

10. A semiconductor wafer including a corrosion monitoring feature, comprising:
a surface including an active die region and a scribeline region that is adjacent said active die region;
an insulating layer disposed above said surface and includes a first corrosion sensitive metal plug and a second corrosion and a second corrosion sensitive metal plug in said scribeline region; and
a metallization layer positioned above said insulating layer, said first corrosion sensitive metal plug and said second corrosion sensitive metal plug in said scribeline region and said metallization layer disposed above said second corrosion sensitive metal plug is patterned to provide said metallization layer with a first opening extending from a top surface of said metallization layer down to a top surface of said second corrosion sensitive metal plug such that a solvent introduced above said top surface of said metallization layer flows into said second corrosion sensitive metal plug disposed below through said first opening in said metallization layer.

11. The semiconductor wafer of claim 10, wherein the insulating layer includes a silicon dioxide layer.

12. The semiconductor wafer of claim 10, wherein the first and the second corrosion sensitive metal plugs include tungsten or aluminum.

13. The semiconductor wafer of claim 10, wherein a length and a width of the first and the second corrosion sensitive metal plugs are between about 3 and about 5 $\mu$m.

14. The semiconductor wafer of claim 10, wherein a depth of the first and the second corrosion sensitive metal plugs is between about 5000 and about 10000 Angstroms.

15. The semiconductor wafer of claim 10, wherein a length of said first opening in said metallization layer is between about 3 $\mu$m and about 5 $\mu$m.

16. The semiconductor wafer of claim 10, wherein a width of said first opening in said metallization layer is between about 0.2 and about 0.4

17. The semiconductor wafer of claim 10, wherein a width of said first opening in said metallization layer is about 0.3 $\mu$m.

18. The semiconductor wafer of claim 10, wherein a depth of said first opening in said metallization layer is between about 4000 and about 8000 Angstroms.

19. The semiconductor wafer of claim 10, wherein the metallization layer above said second corrosion sensitive metal plug includes two of said first openings.

20. The semiconductor wafer of claim 10, wherein said first and said second corrosion sensitive metal plugs are corrosion sensitive contact plugs and said semiconductor wafer further comprising:
a transistor device formed in the active die and scribeline regions;
a contact plug formed in the insulating layer that is deposited in the active die region and said metallization layer being positioned above said contact plug in the active die region and said first and said second corrosion sensitive contact plug in the scribeline region such that said contact plug and said first and said second corrosion sensitive contact plugs provide electrically conductive pathways between the metallization layer and transistor device in the scribeline region, respectively.

21. The semiconductor wafer of claim 20, wherein said transistor device includes source and drain diffusion regions and gate electrode.

22. The semiconductor wafer of claim 10, further comprising:
a third corrosion sensitive metal plug and a fourth corrosion sensitive metal plug formed in said scribeline region and a portion of said metallization layer disposed above said third corrosion sensitive metal plug is patterned to have defined thereon a second opening that extends from said top surface of said metallization layer down to a top surface of said third corrosion sensitive metal plug disposed below such that a solvent introduced above a surface of said metallization layer can flow down into said third corrosion sensitive metal plug through said second opening and said a portion of said metallization layer disposed above said fourth corrosion sensitive metal plug is patterned to have defined thereon a third opening that extends from said top surface of said metallization layer down to a top surface of said fourth corrosion sensitive metal plug disposed below such that a solvent introduced above a surface of said metallization layer can flow down into said fourth corrosion sensitive metal plug through said third opening.

23. The semiconductor wafer of claim 22, wherein said metallization layer has three of said second opening.

24. The semiconductor wafer of claim 22, wherein said metallization layer has five of said third opening.

25. The semiconductor wafer of claim 10, wherein said metallization layer is a second metallization layer, said insulating layer is a dielectric layer and said first and second corrosion sensitive metal plugs are a first and a second corrosion sensitive via plug, respectively, formed in said dielectric layer, said semiconductor wafer further comprising:
a first metallization layer disposed below said dielectric layer and said first and said second corrosion sensitive via plugs such that said first and said second corrosion sensitive via plugs provide electrically conductive pathways between said first and said second metallization layers.

26. The semiconductor wafer of claim 10, further comprising:
a first conductive chain connecting a first series of said first corrosion sensitive metal plugs and a second conductive change connecting a second series of said second corrosion sensitive metal plugs;
a first and a second top probe pad defined on the metallization layer near a top portion of said first and said second series and connected to said first and said second conductive chains, respectively; and
a first and a second bottom probe pad defined on the metallization layer near a bottom portion of said first and said second series and connected to said first and said second conductive chains, respectively.

27. The semiconductor wafer surface of claim 26, wherein said first and said second sensitive corrosion metal plugs are corrosion sensitive via plugs and in said first and said second conductive chains some of said first and said second corrosion sensitive via plugs located adjacent to each other are in the first and the second series connected by the metallization layer and other said first and said second corrosion sensitive via plugs located adjacent to teach other in the first and the second series are connected by another metallization layer that is disposed below said metallization layer, which is not the other metallization layer.

28. The semiconductor wafer surface of claim 26, wherein said first and said second sensitive corrosion metal plugs are a first and a second corrosion sensitive contact plug, respectively, and some of said first and said second corrosion sensitive contact plug located adjacent to each other in the first and the second series are connected by the metallization layer and other said first and said second corrosion sensitive contact plug located adjacent to each other in the first and the second series are connected by diffusion regions formed on the semiconductor wafer surface.

* * * * *